United States Patent [19]

Koizumi et al.

[11] 4,153,371
[45] May 8, 1979

[54] METHOD AND APPARATUS FOR REDUCTION-PROJECTION TYPE MASK ALIGNMENT

[75] Inventors: Mituyoshi Koizumi; Nobuyuki Akiyama, both of Yokohama; Asahiro Kuni, Nakamachi, all of Japan

[73] Assignee: Hitachi, Ltd., Japan

[21] Appl. No.: 771,201

[22] Filed: Feb. 23, 1977

[30] Foreign Application Priority Data

Feb. 25, 1976 [JP] Japan .................................. 51/19004

[51] Int. Cl.² ...................... G01B 11/27; H05K 13/00
[52] U.S. Cl. ........................................ 356/400; 350/81; 356/401
[58] Field of Search ................ 356/138, 156, 153, 168, 356/172, 244; 350/81; 355/71; 364/120, 468; 250/491

[56] References Cited

U.S. PATENT DOCUMENTS

| | | | |
|---|---|---|---|
| 2,343,586 | 3/1944 | Schufftan | 355/71 |
| 3,573,456 | 4/1971 | Beeh | 355/71 |
| 3,796,497 | 3/1974 | Mathisen | 356/172 |
| 3,955,072 | 5/1976 | Johannsmeier | 356/172 |
| 4,052,603 | 10/1977 | Karlson | 356/172 |

OTHER PUBLICATIONS

Osterholzer, E. J., "Apparatus for Electrically Connecting a Probe With an Integrated Circuit," Western Electric Tech. Digest, #26, Apr. 1972, pp. 49-50.

*Primary Examiner*—John K. Corbin
*Assistant Examiner*—Wm. H. Punter
*Attorney, Agent, or Firm*—Craig & Antonelli

[57] ABSTRACT

A mask alignment method of the reduction-projection type comprising the steps of illuminating only regions of alignment patterns formed on a mask and a wafer, before a circuit pattern formed on the mask is projected onto the chips of the wafer through a reduction-projection lens, and aligning the mask and the wafer with each other by detecting the reflected images of both the alignment patterns. The alignment pattern region is illuminated by the light having the same wavelength as the exposure light. In addition, a mask alignment apparatus of the reduction-projection type comprising an illumination device for illuminating the mask. The mask is disposed at a distance from the wafer. The illumination light includes g-line or h-line or a combination of g-line and h-line. The projection lens is interposed between the mask and the wafer so that the circuit pattern formed on the mask is projected on the chips of the wafer on a reduced scale thereby to give the optical printing of the circuit pattern to the wafer. A field diaphragm device is disposed in the vicinity of the mask in order to prevent the exposure of the circuit pattern during the alignment operation. The field diaphragm device is provided with an opaque base plate of the size corresponding to the circuit pattern region and a transparent window of the size corresponding to the alignment pattern. The mirror or the semi-transparent mirror is disposed for reflecting optical images of the alignment patterns of the mask and the wafer in a direction toward a detecting system for displacement. The relative displacement between the mask and the wafer is detected by the detecting system thereby to align the mask and the wafer with each other by moving one of them.

9 Claims, 9 Drawing Figures

FIG. I
PRIOR ART
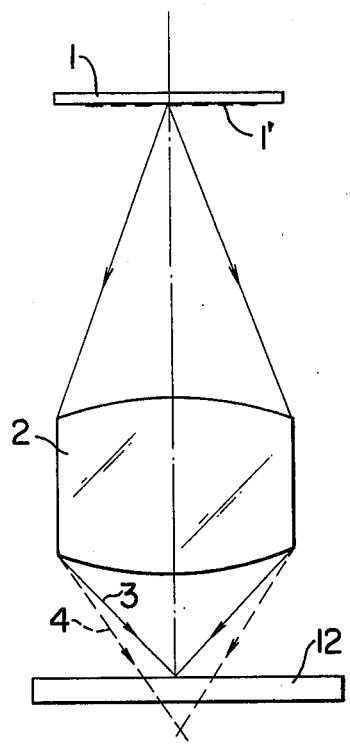
FIG. 4a
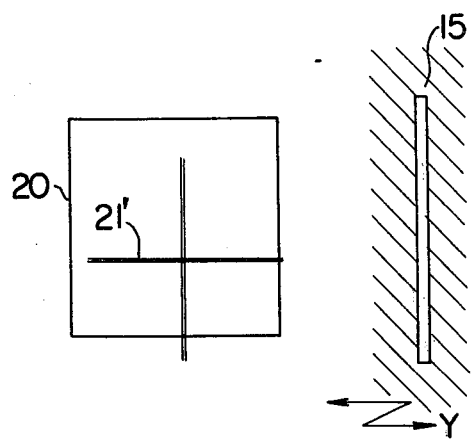
FIG. 4b
FIG. 4c
FIG. 4d
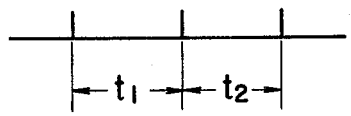

METHOD AND APPARATUS FOR REDUCTION-PROJECTION TYPE MASK ALIGNMENT

BACKGROUND OF THE INVENTION

1. Field of the Invention

This invention relates to a method and an apparatus for reduction-projection type mask and wafer alignment using a projection type exposure technique in the field of manufacture of semiconductor devices, such as IC or LSI.

2. Description of the Prior Art

Generally, the reduction-projection lens 2 for projecting the pattern 1' of the mask 1 onto the wafer 12 as shown in FIG. 1 can be used only with light having a single wavelength in its specification. If light at another wavelength (for example, the mercury e-line which is insensitive to photoresists) is used for alignment, the resolution of the image is deteriorated, and forms an image at a different point from that formed by the exposure light (at the wave length of the mercury g-line 3) due to chromatic aberration. In the conventional method using the mercury e-line 4 for alignment and the mercury g-line 3 (or h- and/or g-line) for exposure, a fine adjustment device is required to correct this vertical displacement on the wafer due to chromatic aberration. The vertical fine adjustment by the fine adjustment device, however, involves an undesired lateral displacement after alignment. In order to eliminate this lateral displacement due to chromatic aberration, a lens having the same focal point for the wavelength of both the mercury e-line and g-line (or h- and/or g-line) has recently been developed, and this lens has an image-reduction ratio of approximately 1/1. However, a comparable lens having a reduction ratio of 1/10 has not been developed as yet for the purpose of optically printing minute patterns on the wafer. In the conventional methods, therefore, optical printing of minute patterns on the wafer by the use of a projection lens requires the fine adjustment device as mentioned above.

When a circuit pattern is optically printed by means of a lens with the image-forming ration of 1/1, a minute pattern less than $5\mu$ in size cannot be projected with high resolution. For this reason, a circuit pattern smaller than a certain size has been incapable of being optically printed on the wafer by 1/1 projection. When the circuit pattern formed on the mask is projected onto the wafer through a reduction-projection lens, the resolution is increased. By this method, a very minute pattern of about $1\mu$ in size can be optically printed on the wafer. In the manufacture of a semiconductor inetegrated circuit on the wafer, however, about 10 masks must be overlaid sequentially on progressively formed circuit patterns. This requires a highly sophisticated technique for each alignment between the mask and the wafer.

SUMMARY OF THE INVENTION

A primary object of the invention is to provide a method and an apparatus for reduction-projection type mask alignment in which the mask and the wafer can be aligned with the same high accuracy as in the reduction-projection exposure operation without any fine adjustment of the lens or the wafer along the optical axis in order to eliminate the focal point difference due to chromatic aberration.

Another object of the invention is to provide a reduction-projection type mask alignment apparatus for optical printing by reduction-projection in which the fine alignment between a mask and a wafer in X and Y directions as well as in a rotational direction is performed with very high accuracy by a simple structure.

According to the present invention, there is provided a reduction-projection type mask alignment method in which, before the circuit pattern formed on the mask is projected through a reduction-projection lens onto the chips of the wafer, the alignment pattern areas formed on the mask and wafer are illuminated by light having the same wavelength as the exposure light. The alignment patterns obtained by detecting the optical images reflected through said lens are used for alignment of the mask and the wafer. Further, according to the invention, there is provided a reduction-projection type mask alignment apparatus in which the mask and the wafer are separated from each other, and the reduction-projection lens is interposed between the wafer and the mask. An illumination device is provided in which the light with the same wavelength as the exposure light illuminates the alignment patterns formed respectively on the mask and the wafer. The optical images of both the alignment patterns reflected through the reduction-projection lens are obtained by the detecting device for displacement. The naked eyes or a photoelectric device may be used as the detecting device for displacement. At least one of the mask and the wafer is moved in accordance with the output of the detecting device for displacement thereby to align the mask and the wafer with each other with high accuracy.

BRIEF DESCRIPTION OF THE DRAWINGS

FIG. 1 is a diagram for illustrating the focal point difference in image-formation by lines of light with different wavelengths due to chromatic aberration.

FIG. 4a is a diagram for illustrating the relation between a slit and the images of the alignment patterns.

FIG. 4b shows a waveform of the detected signal by the slit scanning on the images.

FIGs. 4c and 4d show a binary signal which is transformed from the signal shown in FIG. 4b.

DETAILED DESCRIPTION OF THE PREFERRED EMBODIMENTS

Figure 2:
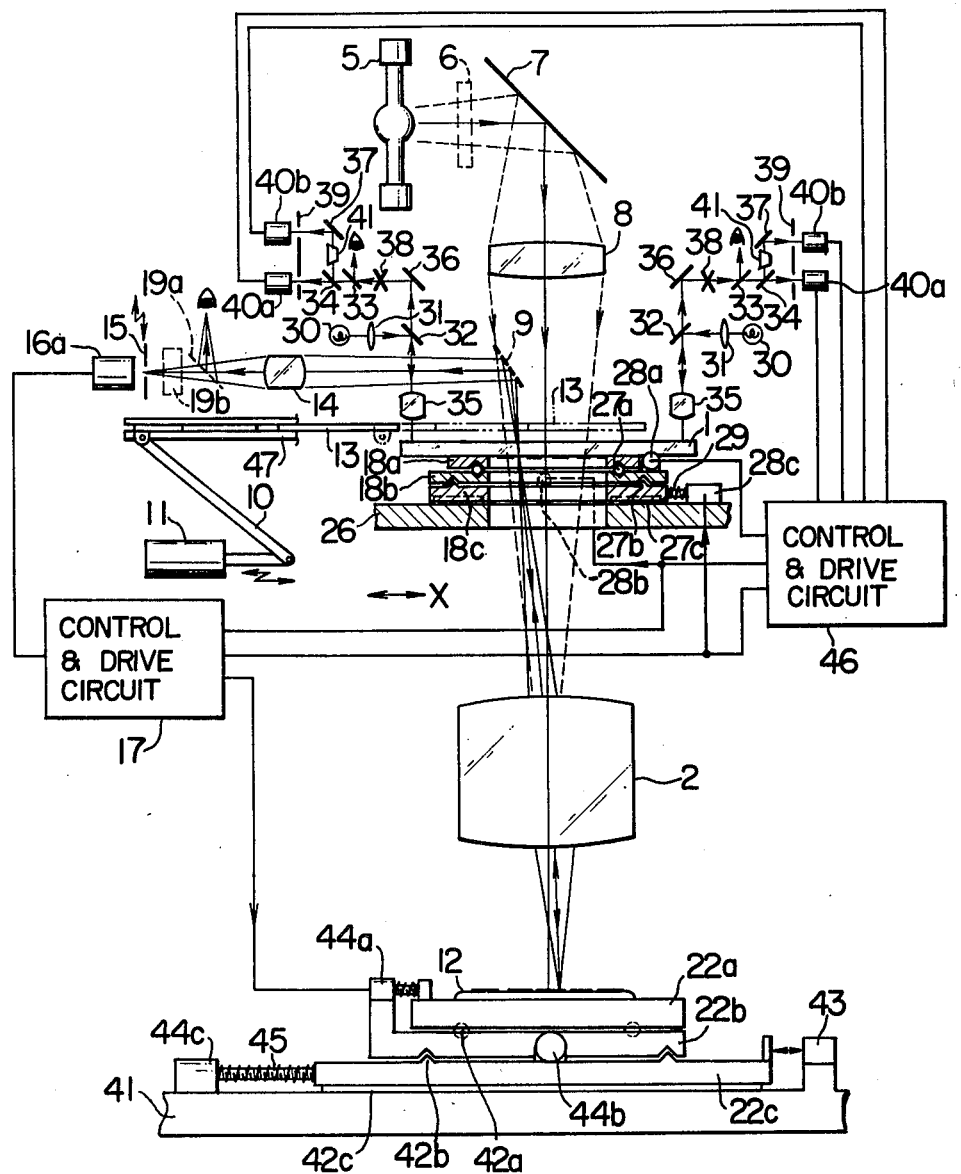
FIG. 2 is a schematic diagram showing a structure of an embodiment of the reduction-projection type mask alignment apparatus according to the present invention.
Figure 3:
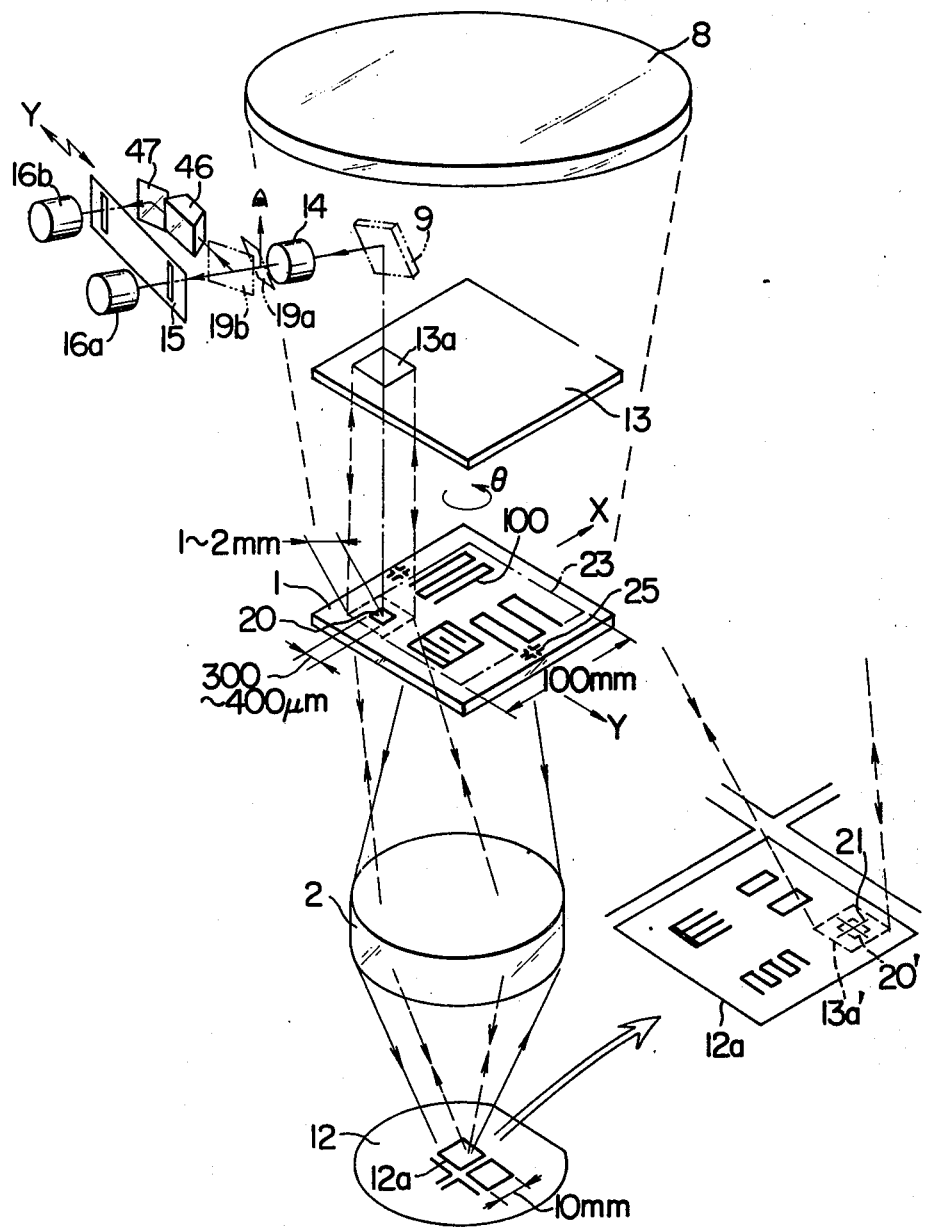
FIG. 3 is a perspective view of the apparatus shown in FIG. 2.

An embodiment of the reduction-projection type mask alignment apparatus according to the present invention is shown in FIGS. 2 and 3. On the lower surface of the mask 1, there are formed a circuit pattern 100 which is about 10 times as large as the circuit pattern to be printed on chip 12a of the wafer 12, an alignment pattern 20 for determining the relative position of the mask 1 with respect to the wafer 12, and mask-positioning patterns 25 for positioning the mask 1 with respect to a reference position by using the microscopes.

Figure 6:
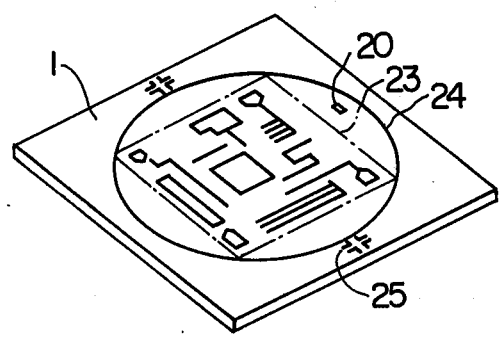
FIG. 6 is a perspective view showing another mask having an alignment pattern at a different position from that of FIG. 3.

The alignment pattern 20 is formed, as shown in FIG. 3, near the edge of the region 23 on the circuit pattern 100. The alignment pattern 20 is arranged approximately 1 to 2 mm inside from the edge of the region 23. This pattern 20 may be made of a rectangular linear pattern as large as 300 to 400 μm. As an alternative, the alignment pattern 20 may be formed at a point outside of the circuit pattern region 23 within the projection region 24 of the condenser lens 8 as shown in FIG. 6. The areas outside of the circuit pattern 23 correspond to the spaces between chips on the wafer, i.e., the areas to be described later. The mask-positioning patterns 25 are placed at both sides of the mask 1 outside of the projection region 24 such as a pattern in the shape of, say, ⊣ ⊢. The rotary table 18a (to be rotated in the direction θ) carries the mask 1 on the upper surface thereof. The Y-axis feed table 18b rotatably supports the rotary table 18a by means of a bearing 27a and is so constructed as to finely rotate the rotary table 18a with the drive motor 28a mounted on the upper surface of the Y-axis feed table 18b. The X-axis feed table 18c, on the other hand, supports the Y-axis feed table 18b slidably along the Y-axis as one absolute coordinate (in the direction perpendicular to the sheet of the drawing in FIG. 2), by means of the bearing 27b. The Y-axis feed table 18b is adapted to be displaced finely along the Y-axis through a feed screw by a drive motor 28b mounted on the X-axis feed table 18c. The X-axis feed table 18c is slidably mounted on the base 26 along the X-axis, as another absolute coordinate through the bearing 27c. The X-axis feed table 18c is adapted to be finely displaced along the X-axis through a feed screw by the drive motor 28c on the base 26, with any backlash eliminated by the spring 29.

First, the mask 1 is fixedly mounted by means of vacuum absorption on the rotary table 18a and aligned in the direction in which the wafer is driven by step and repeat. Each of the microscopes comprises a light source 30, a condenser lens 31, semi-transparent mirrors 32, 33 and 34, and objective lens 35, reflection mirrors 36 and 37, a mask-positioning cross-shaped linear pattern 38, a vibrating slit 39, light-receiving elements or detectors 40a and 40b and an image rotator 41. These microscopes are located in two sets corresponding to the mask-positioning patterns 25 formed on both sides of the mask 1. Though these microscopes are located above the mask 1 as shown in FIG. 2, they may be placed under the mask 1 when the space above the mask 1 is occupied by the condenser lens 8. With the vibration of the slit 39, both the optical images of the mask-positioning patterns 25 and the cross-shaped reference linear patterns 38 located fixedly in the microscopes are scanned in both the directions of the X and Y axes (where the images are rotated by 90° through the image rotator 41). The detectors 40a and 40b generate output signals by scanning the slits 39. The relative displacement between the reference linear patterns 38 and the mask-positioning patterns 25 is determined from those output signals. The rotary table 18a is rotated by the drive motor 28a through the control and drive circuit 46 so as to reduce the angular displacement to zero, and then the drive motors 28b and 28c are driven through the control and drive circuit 46, so that the Y-axis feed table 18b and the X-axis feed table 18c are finely adjusted in respective directions thereby to place the mask 1 at the reference position. The mask 1 thus placed at the reference position is illuminated by the exposure light produced by the mercury lamp 5 through the sharp cut filter 6 allowing the transmission of only the particular wavelengths (g- and/or h-line), the mirror 7 and condenser lens 8. By this exposure light, the scattered light generated at the mask pattern enters the entrance pupil of the projection lens 2 and then the light going out of the exit pupil forms an image on the wafer 12 reduced to 1/10 in size. Since the mask 1 has a circuit pattern for one or several chips of the wafer, in order to complete the exposure of all the chips of the wafer 12, the X-axis feed table 22c and the Y-axis feed table 22b are moved by a step-and-repeat drive system (not shown in the drawing). This step-and-repeat drive system is arranged such that the position of the X-axis feed table 22c supported on the base 41 through the bearing 42c movable along the X-axis with very high accuracy can be detected by a measuring instrument utilizing laser light 43 mounted on the base 41. The X-axis feed table 22c is subjected to step and repeat drive with the drive motor 44c and a feed screw with backlash eliminated by the spring 45 in such a manner as to secure the pitch of the chip interval along the X-axis. The position of the Y-axis feed table 22b, on the other hand, which is supported on the X-axis feed table 22c through the bearing 42b movably along the Y-axis with very high accuracy, is measured by the measuring instrument utilizing a laser light (not shown in FIG. 2) mounted on the base 41. And the Y-axis feed table 22b is driven by step and repeat with the drive motor 44b and the feed screw mechanism in such a manner as to attain a pitch of the chip interval along the Y-axis. A field diaphragm 13 is transferred by means of a transfer system 10 with a cylinder 11. This field diaphragm 13 has a transparent window 13a at the position corresponding to the alignment pattern 20 on the mask 1 and an opaque part. The field diaphragm 13 has substantially the optically same size as the mask 1 and prevents exposure of the circuit pattern 100 during the alignment operation of the mask 1 and the wafer 12 before the exposure operation. The light passing through the window 13a of the field diaphragm 13, as shown by solid lines illuminates the area on the periphery of the square alignment pattern 20 of the mask 1. This light also passes through the projection lens 2 and illuminates the area on the periphery of the cross-shaped alignment pattern 21 of the wafer 12, and at the same time in the illuminated part 13a', a superimposed image of the alignment pattern 20 is formed in the vicinity of the alignment pattern 21. The wafer 12 is coarsely aligned with the microscope at the pre-alignment station and carried and placed at a reference position on the upper surface of the rotary table 22a with a cassette jig (not shown) and positioning pins (not shown). As a result, the precise or fine alignment at the station shown in FIG. 2 is made possible by the use of an objective lens with a high magnification and narrow field of view, because the alignment patterns 20' and 21 have already been aligned coarsely. The patterns 20' and 21 are projected inversely by the projection lens 2 and form their images on the lower surface of the mask 1. The images which show the relative displacement (shown in FIG. 4a), is observed with the semi-transparent mirror 19a and the objective lens 14 after horizontal positioning with the semi-transparent mirror 9 as small as the alignment pattern. The light that passes the semi-transparent mirror 19a enlarges and forms an image of one pattern directly on the slit 15 through the semi-transparent mirror 19b. The same pattern, as shown in FIG. 3, is reflected on the semi-transparent mirror 19b, rotated by 90° by the image rotator 46 and forms enlarged images through the reflection mirror 47. The slit 15 is subjected to scanning at a fixed speed along the Y-axis, so that the detectors 16a and 16b, which are photo-electric elements, can detect alignment displacements along the Y and X axes respectively. As shown in FIG. 4a, for instance, the alignment displacement along the Y-axis is determined by scanning the slit 15 leftward on the images of the patterns. A waveform of the detection signal as shown in FIG. 4b is produced. This signal is converted into a binary signal by means of a binary circuit (not shown) and the waveform of this binary signal is shown in FIG. 4c. With respect to the centers of the binary signal pulses (FIG. 4d), time $t_1$ and $t_2$ are determined, and the difference therebetween ($t_1 - t_2$) is calculated by the control and drive circuit 17. This time difference ($t_1 - t_2$) corresponds to the displacement between the alignment patterns.

In order to detect angular displacement between mask 1 and wafer 12, the following operations are performed. The drive motor 44c drives the X-axis feed table 22c in a step and repeat direction leftward thus placing the rightmost chip of the wafer 12 under the center of the projection lens 2. With the aid of the detecting system, the relative displacement $\Delta Y_1$ between the alignment pattern 21 of the rightmost chip and the alignment pattern 20 of the mask is detected. Next, the drive motor 44c drives in order to move the X-axis feed table 22c to the right thereby to place the leftmost chip of the wafer 12 under the center of the projection lens 2. With this operation, the relative displacement $\Delta Y_2$ between the alignment pattern 21 of the leftmost chip and the mask alignment pattern 20 is detected by the detecting system. From the difference between the displacements ($\Delta Y_1 - \Delta Y_2$) and the distance l from the rightmost chip to the leftmost chip, $\eta \approx \Delta Y_1 - \Delta Y_2/l$ is obtained. Thus, control and drive circuit 17 detects angular displacement $\theta$ between mask 1 and wafer 12. Then the drive motor 44a is driven by the angle $\theta$ through the control and drive circuit 17 thereby to rotate the rotary table 22a carrying the wafer 12 and supported rotatably by the bearing 42a, thus reducing the difference in displacement ($\Delta Y_1 - \Delta Y_2$) to zero. In this way, the direction of arrangement of the chips of the wafer 12 and the direction of the step and repeat operations (i.e., the rotational direction $\Theta = 0$) are aligned very accurately by the use of a single detection system. Next, the X-axis feed table 22c is moved, in order to place a certain chip 12a under the center of the projection lens 2. With the aid of the detecting system, the displacements between the mask alignment pattern 20 and the wafer alignment pattern 21 along the X and Y axes are obtained as in the previous way. In order to eliminate these displacements, the Y-axis feed table 18b and the X-axis feed table 18c carrying the mask 1 are driven by the control and drive circuit 17, then the accurate alignment between the mask 1 and the wafer 12 is obtained. If the relative displacement on the wafer is, say, 1 μm, the mask may be moved by 10 μm to align the mask 1 and the chip 12a because the reduction ratio of the projection lens is 1/10. A positioning system having an accuracy of about 10 μm is easily realized, but it is very difficult to realize the positioning system with accuracy of less than 1 μm. This is the reason why the tables carrying the mask are moved along the two axes of X and Y. In order to project the circuit pattern 100 onto the chip 12a for exposure, the following operations are required: The field diaphragm 13 guided by the guide 47 is extracted by the transfer system 10 including the cylinder 11, and then the circuit pattern 100 is projected onto the chip 12a for exposure. The X-axis feed table 22c and the Y-axis feed table 22b are driven by step and repeat movement, while illuminating the circuit pattern 100 of the mask 1 on the respective chips on the wafer 12 by the exposure light, thus forming all chips on the wafer 12.

In the case where a negative photoresist is used for the wafer 12, the part of the photoresist illuminated by light is hardened and therefore the alignment pattern 20 formed at the initial exposure step still remains usable at the last alignment step. In this case, to prevent optical printing of the mask alignment pattern 20 at each step, the illuminated part 13a' of the wafer is required to be subjected to what is called "pre-exposure" before alignment in the alignment step.

When a positive photoresist is used, on the other hand, the photoresist illuminated by light is removed after development, and therefore the wafer alignment pattern 20 disappears after development and etching at each alignment step. Thus at each alignment step, another alignment pattern 21 to be used for the next alignment step is to be printed at the other portion than the illuminated art 13a'.

Figure 5:
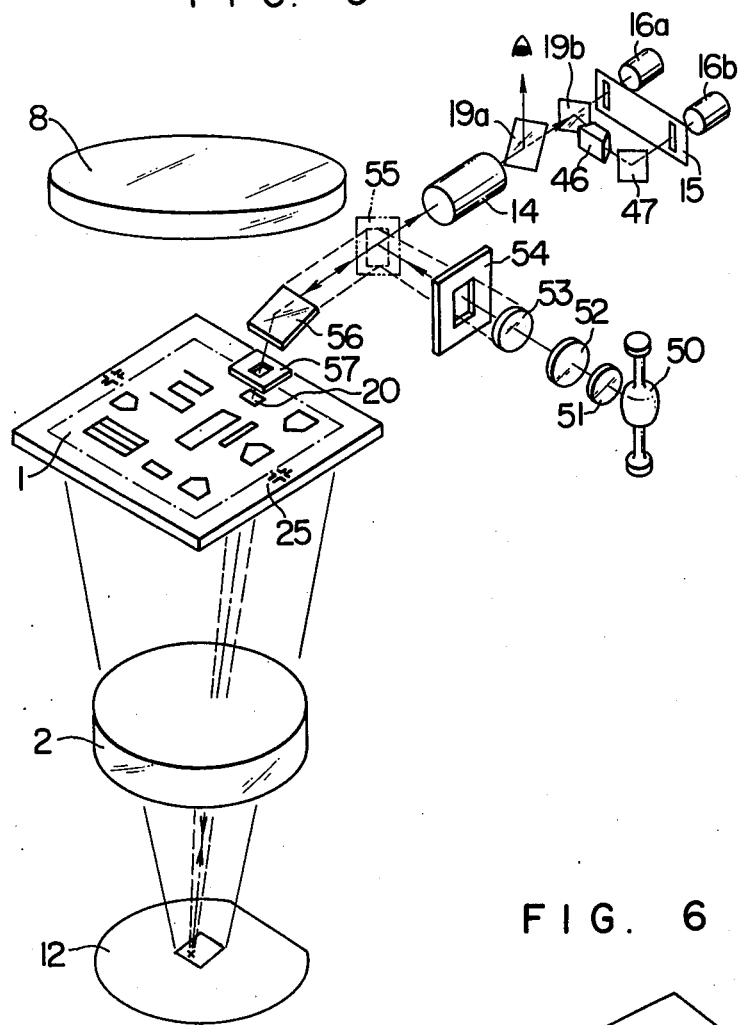
FIG. 5 is a diagram showing an alignment optical system according to another embodiment of the reduction-projection type mask alignment apparatus according to the invention.

In the preceding embodiment, the field diaphragm 13 corresponding to the size of the mask 1 is transferred into and out of the exposure light path by means of the transfer mechanism 10. Since this operation causes a vibration possibly leading to slight movement of the mask placed at the reference position, the device as shown in FIG. 5 may be used to prevent such a vibration, which is another embodiment of the invention. This device includes an alignment mercury lamp 50 similar to the exposure mercury lamp 5 in the previous embodiment, for generating light of the same wavelength, and a sharp cut filter 51 identical to the sharp cut filter 6. The light produced from the mercury lamp 50 and passed through the sharp cut filter 51 is condensed to the size corresponding to the alignment pattern at least through a couple of condenser lenses 52 and 53. The resulting condensed light is further condensed by the mask 54, changed in direction by the semi-transparent mirror 55, reflected on the small reflection mirror 56 on the upper surface of the mask 1, and then illuminates only the alignment pattern region of the mask 1. In order to prevent the wafer 12 from being printed by this light with the circuit pattern formed in the neighbourhood of the alignment pattern of the mask 1, a shutter 57 is provided in the vicinity of the mask 1. The other structure is the same as in FIG. 3.

In the alignment step, the mercury lamp 50 instead of the mercury lamp 5 is turned on, thus permitting the mask 1 and the wafer 12 to be aligned with each other without optical printing of the circuit pattern of the mask 1 on the chips of the wafer 12.

It will be understood from the foregoing description that according to the present invention the design and working wavelength of the projection lens may be limited to the exposure light, thereby making possible positional alignment of the mask 1 and the wafer 12 by the use of a low-cost projection lens. In this way, a low-cost positional alignment apparatus is obtained with a conventional projection lens such as a photo-repeater. According to the invention, the wafer 12 is moved in two directions of X and Y axes by step and repeat so that the circuit pattern formed on the mask 1 is optically printed on the wafer 12 in the form of a multiplicity of chips. In the process, optical images inversely projected onto the alignment pattern 21, 20' are first detected by the use of the spot-light. The rotary table carrying the wafer 12 is slightly rotated to bring the direction of arrangement of the chips on the wafer 12 into alignment with the direction of step and repeat movement of the wafer 12. The feed tables carrying the mask 1 are moved in two directions of X and Y axes and thus the displacement in the two directions between the mask and the wafer is eliminated thereby to align them with each other. By this simple structure of the apparatus according to the invention, the alignment accuracy both in the rotational direction and along the two axes of X and Y is greatly improved.

In the embodiment of FIG. 3, the field diaphragm 13 may be inserted into the exposure system at any position either on the condenser lens side or wafer side of the mask, if it is disposed in proximity to the mask 1.

We claim:

1. A mask alignment apparatus of reduction-projection type, comprising:

a mask table carrying a mask having an alignment pattern and a circuit pattern formed thereon, said mask table being finely rotatable and movable in two directions along X and Y orthogonal axes;

a wafer table for carrying a wafer, having an alignment pattern thereon, disposed at a distance from said mask, said wafer table being finely rotatable and movable in step and repeat movement at a predetermined pitch in two directions of the X and Y axes;

a reduction-projection lens interposed between said mask and said wafer so that an image of said circuit pattern is projected onto the chips of said wafer through said lens;

means for illuminating said alignment patterns of said mask and said wafer by a light having the same wavelength as an exposure light;

displacement detecting means for detecting the relative displacement between both images of said alignment patterns inversely projected through said lens;

first alignment means for moving said wafer table in a selected one of the directions of said X and Y axes by a distance between at least two remote chips and rotating said wafer table in accordance with at least two relative displacements obtained from said displacement detecting means thereby to cause the direction of step and repeat movement of said wafer table along the selected one of said X and Y axes to coincide with the direction of arrangement of said chips of said wafer;

second alignment means for moving said mask table at least in the two directions of said X and Y axes in accordance with the relative displacement between said predetermined alignment patterns obtained from said displacement detecting means thereby to align said mask and said wafer with each other;

at least microscope means for detecting the relative displacement between reference patterns disposed at a predetermined position and respective mask alignment patterns formed at least on both side portions of said mask; and means for rotating said mask table so as to eliminate the difference between both said relative displacements thereby to align said mask in the directions of said X and Y axes.

2. A mask alignment apparatus according to claim 1, wherein said illumination means comprises: means for illuminating by said exposure light said circuit pattern and said alignment patterns formed on said mask from the opposite side of said mask to said lens; and diaphragm means disposed in the vicinity of said mask and including an opaque base plate of the size corresponding to said circuit pattern region and a transparent window of the size corresponding to said alignment patterns, said diaphragm means being transferred in a light path of said illumination means during alignment operation and transferred out of said light path during an exposure operation.

3. A mask alignment apparatus according to claim 1, wherein said illumination means comprises spot-lighting means for illuminating only the alignment pattern regions of said mask during the alignment operation.

4. A mask alignment apparatus according to claim 1, wherein said displacement detecting means comprises slits scanned, and a plurality of photoelectric elements for detecting optical images passing through said slits.

5. A mask alignment apparatus according to claim 1, wherein said displacement detecting means comprises a semi-transparent mirror disposed above said mask on its opposite side to said lens, and an objective lens for forming the image of said alignment patterns formed on said mask and said wafer.

6. A projection type alignment apparatus comprising:

(a) a mask table for carrying a mask having at least a pair of mask-positioning patterns spaced by a distance on the marginal parts thereof, an alignment pattern and a circuit pattern formed thereon, said mask table being arranged to rotate said mask in a horizontal plane as well as move said mask in the two directions of respective orthogonal X and Y axes;

(b) a wafer table carrying a wafer having an alignment pattern disposed thereon, said waver being disposed at a distance in parallel to said mask, said wafer table being movable in step and repeat movement at a predetermined pitch in at least the two directions of said X and Y axes;

(c) a projection lens interposed between said mask and said wafer so that a reduced image of said circuit pattern may be projected therethrough onto a chip of said wafer;

(d) mask positioning means for positioning said mask with respect to absolute co-ordinates constituting said X and Y axes by optically superimposing said pair of mask-positioning patterns onto at least a pair of reference patterns disposed at predetermined positions of said absolute co-ordinates, including means to detect the respective amounts of relative displacement therebetween and means for rotating and moving said mask table in the two directions of said X and Y axes so as to eliminate said amounts of relative displacement;

(e) illuminating means for illuminating only a region of said alignment pattern of said wafer with light defined by a field diaphragm through a region of the alignment pattern of said mask which is relatively and roughly aligned with said wafer by said mask-positioning means said light having the same wavelength as an exposure light;

(f) displacement detecting means for detecting the amount of relative displacement between said alignment patterns by forming a reflection image which is derived from superposition of said alignment patterns through said projection lens; and (g) means for making a fine alignment between said mask and wafer in accordance with the amount of relative displacement outputted from said displacement detecting means by moving said wafer table at a predetermined pitch in step and repeat movement thereby to finely and relatively rotate and move said mask and wafer in the two directions of said X and Y axes.

7. A projection type alignment apparatus according to claim 6, wherein said mask-positioning means comprises a pair of microscopes and said reference pattern is disposed in each of said microscopes and used as a reference of said absolute co-ordinates.

8. A projection type alignment apparatus according to claim 6, wherein said fine alignment between said mask and wafer in two directions of said X and Y axes is made by finely moving said mask table in two directions of said X and Y axes in accordance with an amount of relative displacement in two direction of said X and Y axes which is outputted from said displacement detecting means.

9. A projection type alignment apparatus according to claim 6, wherein said fine alignment between said mask and wafer in rotational direction is made by finely rotating said wafer table in accordance with an amount of relative displacement in said rotational direction which is outputted from said displacement detecting means.

* * * * *